United States Patent
Do et al.

(10) Patent No.: US 8,049,314 B2
(45) Date of Patent: Nov. 1, 2011

(54) INTEGRATED CIRCUIT PACKAGE SYSTEM WITH INSULATOR OVER CIRCUITRY

(75) Inventors: Byung Tai Do, Singapore (SG); Seng Guan Chow, Singapore (SG); Heap Hoe Kuan, Singapore (SG); Linda Pei Ee Chua, Singapore (SG); Rui Huang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 399 days.

(21) Appl. No.: 12/126,684

(22) Filed: May 23, 2008

(65) Prior Publication Data

US 2009/0127683 A1    May 21, 2009

Related U.S. Application Data

(60) Provisional application No. 60/988,724, filed on Nov. 16, 2007.

(51) Int. Cl.
*H01L 23/495* (2006.01)
*H01L 21/58* (2006.01)

(52) U.S. Cl. ......... 257/676; 257/E23.036; 257/E21.505; 257/686; 257/685; 257/777; 257/723; 257/684; 257/796; 257/666; 257/738; 257/737; 257/778; 257/784; 257/786

(58) Field of Classification Search ............ 257/686, 257/685, 777, 723, 684, 796, 666, 738, 737, 257/778, 784, 786, E23.036, 676, E21.505
See application file for complete search history.

(56) References Cited

U.S. PATENT DOCUMENTS

| | | | |
|---|---|---|---|
| 6,455,941 B1 | 9/2002 | Lee et al. | |
| 6,559,525 B2* | 5/2003 | Huang | 257/675 |
| 6,844,622 B2* | 1/2005 | Huang et al. | 257/706 |
| 7,049,691 B2 | 5/2006 | Karnezos | |
| 7,074,647 B2* | 7/2006 | Owens et al. | 438/108 |
| 7,332,372 B2 | 2/2008 | Derderian | |
| 7,385,299 B2* | 6/2008 | Chow et al. | 257/787 |
| 7,482,686 B2 | 1/2009 | Zhao et al. | |
| 7,495,344 B2 | 2/2009 | Usui et al. | |
| 7,501,693 B2 | 3/2009 | Chu et al. | |
| 7,569,922 B2* | 8/2009 | Ogata | 257/686 |
| 7,629,677 B2 | 12/2009 | Youn et al. | |
| 7,633,144 B1* | 12/2009 | Kim et al. | 257/678 |
| 7,645,640 B2 | 1/2010 | Lee et al. | |
| 2003/0205801 A1* | 11/2003 | Baik et al. | 257/686 |
| 2006/0197207 A1 | 9/2006 | Chow et al. | |
| 2006/0275952 A1 | 12/2006 | Gowda et al. | |
| 2007/0108621 A1 | 5/2007 | Park | |
| 2007/0200248 A1 | 8/2007 | Ong | |
| 2007/0278696 A1 | 12/2007 | Lu et al. | |
| 2008/0017972 A1 | 1/2008 | Bauer et al. | |
| 2008/0203549 A1* | 8/2008 | Chow et al. | 257/673 |

(Continued)

FOREIGN PATENT DOCUMENTS

JP    61-158153 A    7/1986

(Continued)

*Primary Examiner* — A Williams
(74) *Attorney, Agent, or Firm* — Mikio Ishimaru

(57) ABSTRACT

An integrated circuit package system includes: providing a connection array; attaching a base integrated circuit adjacent the connection array; attaching a package integrated circuit over the base integrated circuit; attaching a package die connector to the package integrated circuit and the connection array; and applying a wire-in-film insulator over the package integrated circuit, the package die connector, the base integrated circuit, and the connection array, wherein the connection array is partially exposed.

20 Claims, 3 Drawing Sheets

U.S. PATENT DOCUMENTS

| | | | |
|---|---|---|---|
| 2009/0092205 A1* | 4/2009 | Amano | 375/340 |
| 2009/0127680 A1 | 5/2009 | Do et al. | |
| 2009/0127683 A1* | 5/2009 | Do et al. | 257/676 |
| 2009/0309207 A1* | 12/2009 | Chow et al. | 257/686 |
| 2010/0001391 A1* | 1/2010 | Do et al. | 257/686 |
| 2010/0117205 A1* | 5/2010 | Do et al. | 257/670 |
| 2010/0193926 A1* | 8/2010 | Do et al. | 257/676 |

FOREIGN PATENT DOCUMENTS

| | | |
|---|---|---|
| JP | 2001-018330 A | 1/2001 |
| JP | 2003-100807 A | 4/2003 |
| WO | 2006054473 A1 | 5/2006 |

* cited by examiner

INTEGRATED CIRCUIT PACKAGE SYSTEM WITH INSULATOR OVER CIRCUITRY

CROSS-REFERENCE TO RELATED APPLICATION(S)

This application claims the benefit of U.S. Provisional patent application No. 60/988,724 filed Nov. 16, 2007, and the subject matter thereof is incorporated herein by reference thereto.

The present application contains subject matter related to U.S. Pat. No. 7,923,846. The related application is assigned to STATS ChipPAC Ltd. and the subject matter thereof is incorporated herein by reference thereto.

TECHNICAL FIELD

The present invention relates generally to integrated circuit packages and more particularly to integrated circuit package systems with stacking modules.

BACKGROUND ART

Electronic devices require integrated circuits formed as chips or die to perform the many functions for the products with electronic controls or features. As these products include more features or become smaller, the demands for packaging the integrated circuits become increasingly difficult to achieve.

Electronic products can be involved in virtually all aspects of our modern lives. Electronic devices can be embedded in products such as telephones, kitchen appliances, televisions, automobiles, and many other products that require controls, displays, or information storage particularly in small devices or spaces.

The reduction in size of the actual integrated circuits has not improved rapidly enough to keep up with these demands. This has caused larger integrated circuits as well as the need to combine multiple integrated circuits within a single integrated circuit package. The integrated circuits can be arrayed, stacked, or both.

Stacking integrated circuits or modules with integrated circuits require significant spacing for electrical connections to other components within a package or to the base package itself. The increased spacing results in a significantly larger overall package. Stacking also increases the electronic content causing increasing heat.

There have been many attempts to maintain much less reduce size, costs, manufacturing losses, or subsystem failures. In some attempts, connections to a subsystem board cause poor reliability or failures. In other attempts, additional mechanical or chemical cleaning steps are required increasing costs or unusable product.

Virtually all previous attempts have had difficulty with efficient space utilization leaving significant unusable area in or around the package. The previous attempts also typically require more or costly materials as well as more or costly processing methods including systems.

Thus, a need still remains for improving packaging density while maintaining reliability, yield, and manufacturing throughput to improve features, performance and control costs in systems for integrated circuit packages.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention includes: providing a connection array; attaching a base integrated circuit adjacent the connection array; attaching a package integrated circuit over the base integrated circuit; attaching a package die connector to the package integrated circuit and the connection array; and applying a wire-in-film insulator over the package integrated circuit, the package die connector, the base integrated circuit, and the connection array, wherein the connection array is partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
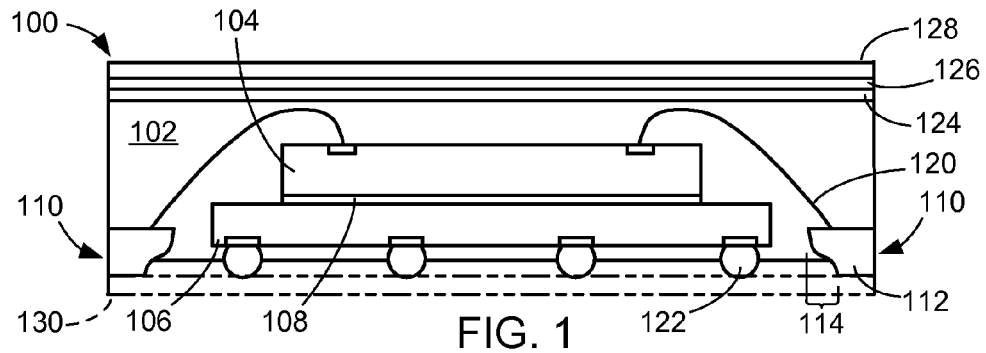
FIG. 1 is a cross-sectional view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a cross-sectional view of an integrated circuit package system 100 in a first embodiment of the present invention. The integrated circuit package system 100 preferably includes a wire-in-film insulator 102 and a package integrated circuit 104 over a base integrated circuit 106.

For example, the wire-in-film insulator 102 can be formed of a penetrable encapsulation material. The wire-in-film insulator 102 can also be flowable such as a B-stage material providing conformal coverage of components including gaps around the components. The wire-in-film insulator 102 can also be curable thus hardening during a curing process.

The package integrated circuit 104 such as a wire bond die or a pre-tested known good inverted ISM or BGA package can be attached or mounted over the base integrated circuit 106 with an attach material 108. The base integrated circuit 106 such as a flip chip die or a pre-tested known good inverted ISM or BGA package can be attached or mounted adjacent a connection array 110 such as a lead array for a leadless package.

The connection array 110 can optionally include array connectors 112 having a protrusion 114. The protrusion 114 registers or locks the array connectors 112 in the wire-in-film insulator 102 providing a substantially fixed position for each of the array connectors 112.

The package integrated circuit 104 can be electrically connected to the connection array 110 with package die connectors 120 such as bond wires, planar interconnect, or other conductors. The base integrated circuit 106 can use base die connectors 122 for electrical connectivity to another component such as a next level system.

A buffer layer 124 can be applied over the wire-in-film insulator 102 on a side opposite the connection array. The buffer layer 124 can include an insulation material providing compensation for mismatched coefficients of thermal expansion between an adhesive layer 126 and the wire-in-film insulator 102.

The adhesive layer 126 can be applied over the buffer layer 124 for attaching or mounting a stiffener 128 such as organic material, polymeric material, metal, ceramic or other material including a heat spreader material. The stiffener 128 can be attached or mounted over the adhesive layer 126 during processing and can optionally be removed after processing.

A carrier 130 can also be optionally provided during processing for attaching or mounting the connection array 110 or the package integrated circuit 104. The carrier 130 can be temporary or sacrificial for some of the embodiments particularly for some of the connection array 110 formed as a laminate substrate.

For example, the wire-in-film insulator 102, the buffer layer 124, or the adhesive layer 126 can be pre-attached to the stiffener 128 before attachment to the package integrated circuit 104. The array connectors 112, the package integrated circuit 104, or the base integrated circuit 106 can be partially embedded into the wire-in-film insulator 102.

The wire-in-film insulator 102 can be pressed down over the package integrated circuit 104, the base integrated circuit 106, or the package die connectors 120 without bending the package die connectors 120 and coming together under the package die connectors 120.

It has been unexpectedly discovered that the integrated circuit package system 100 having the wire-in-film insulator 102, the package integrated circuit 104, and the base integrated circuit 106 simplifies manufacturing, improves assembly yield, improves board level reliability, and utilizes the area under a die attach region.

Figure 2:
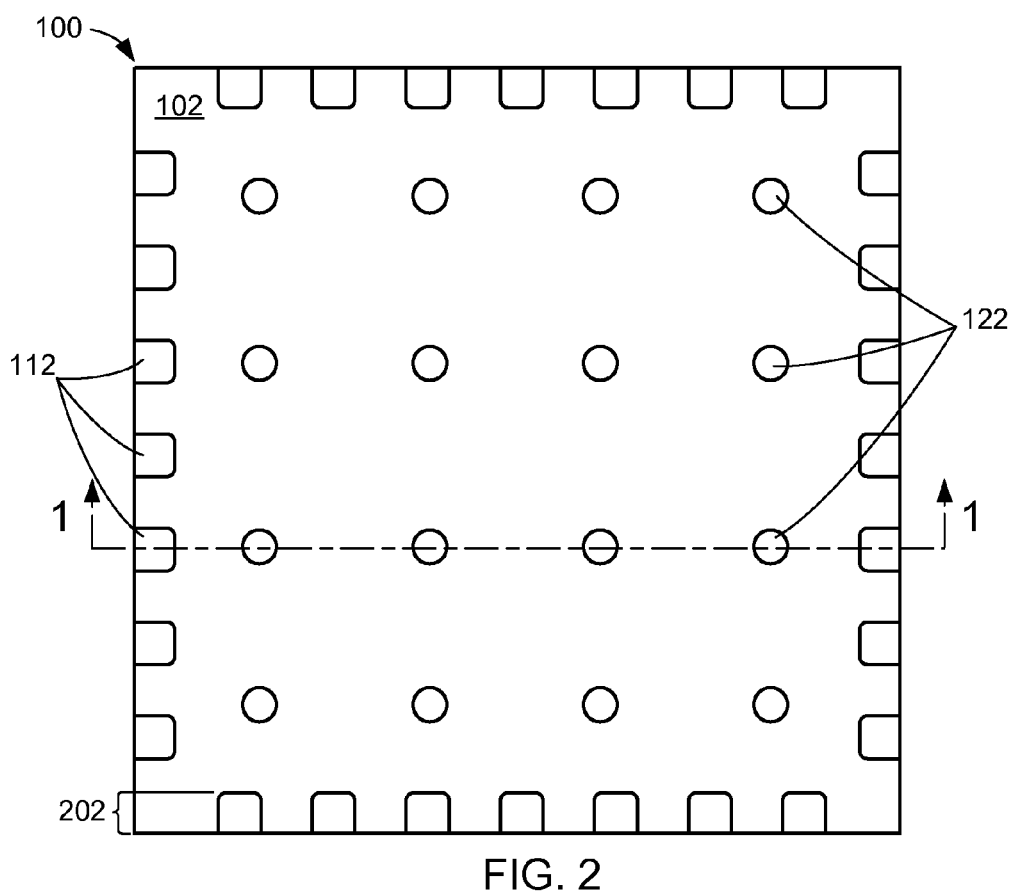
FIG. 2 is a bottom plan view of the integrated circuit package system.

Referring now to FIG. 2, therein is shown a bottom plan view of the integrated circuit package system 100. The integrated circuit package system 100 preferably includes the wire-in-film insulator 102, the array connectors 112, and the base die connectors 122 of the base integrated circuit 106 of FIG. 1.

The wire-in-film insulator 102 can cover a portion of the array connectors 112 providing a substantially fixed position for each of the array connectors 112 as well as exposing a lead exposed surface 202 of the array connectors 112. Similarly, the wire-in-film insulator 102 can make the base die connectors 122 partially exposed.

Exposed portions of the base die connectors 122 and the lead exposed surface 202 can provide electrical connectivity to another component including a next level subsystem or system such as another package or a printed circuit board.

Figure 3:
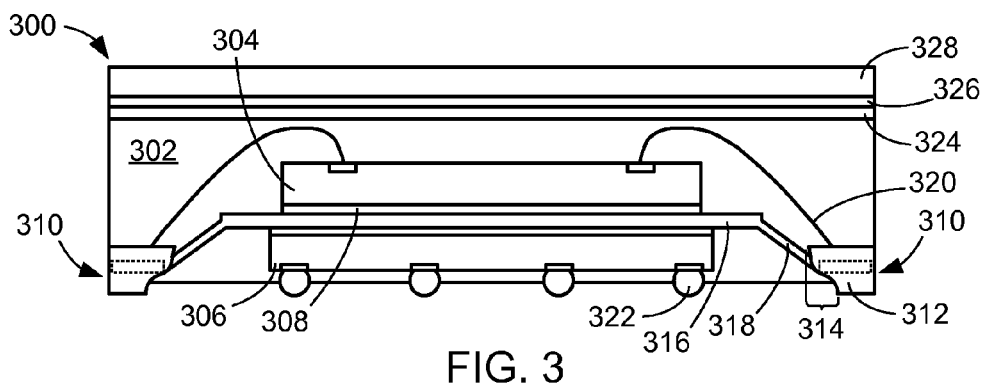
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes a wire-in-film insulator 302 and a package integrated circuit 304 over a base integrated circuit 306.

The wire-in-film insulator 302 can be formed of a wire-in-film encapsulation material. The wire-in-film insulator 302 can also be flowable such as a B-stage material providing conformal coverage of components including gaps around the components. The wire-in-film insulator 302 can also be curable thus hardening during a curing process.

The package integrated circuit 304 such as a wire bond die or a pre-tested known good inverted ISM or BGA package can be attached or mounted over the base integrated circuit 306 with an attach material 308. The base integrated circuit 306 such as a flip chip die or a pre-tested known good inverted ISM or BGA package can be attached or mounted adjacent a connection array 310 such as a lead array for a leadless package.

The connection array 310 can optionally include array connectors 312 having a protrusion 314. The protrusion 314 registers or locks the array connectors 312 in the wire-in-film insulator 302 providing a substantially fixed position for each of the array connectors 312.

A connection array pad 316 such as a punched-up die pad or up-set die pad can connect to the connection array 310 with a tie bar 318. The tie bar 318 can preferably be severed or disconnected during processing to provide electrical isolation for the connection array pad 316.

The package integrated circuit 304 can be electrically connected to the connection array 310 with package die connectors 320 such as bond wires, planar interconnect, or other conductors. The base integrated circuit 306 can use base die connectors 322 for electrical connectivity to another component including a next level subsystem or system.

A buffer layer 324 can be applied over the wire-in-film insulator 302 on a side opposite the connection array. The buffer layer 324 can include an insulation material providing compensation for mismatched coefficients of thermal expansion between an adhesive layer 326 and the wire-in-film insulator 302.

The adhesive layer 326 can be applied over the buffer layer 324 for attaching or mounting a stiffener 328 such as organic material, polymeric material, metal, ceramic or other material including a heat spreader material. The stiffener 328 can be attached or mounted over the adhesive layer 326 during processing and can optionally be removed.

Figure 4:
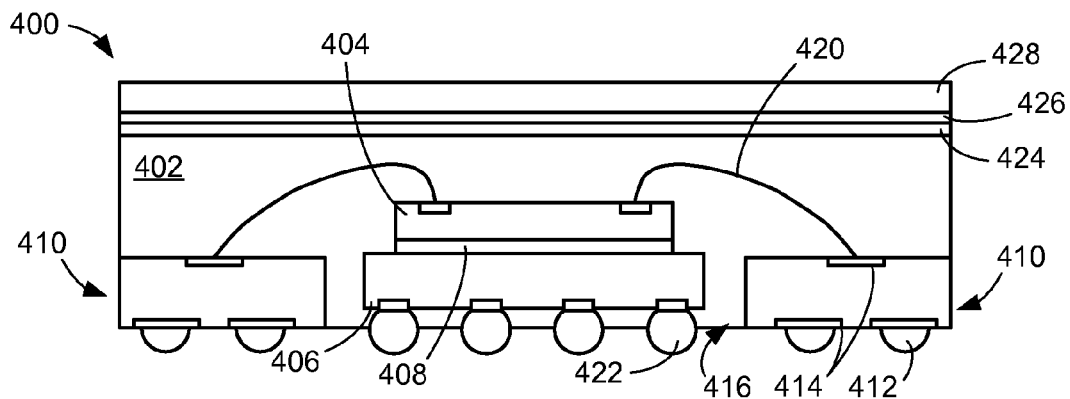
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes a wire-in-film insulator 402 and a package integrated circuit 404 over a base integrated circuit 406.

The wire-in-film insulator 402 can be formed of a wire-in-film encapsulation material. The wire-in-film insulator 402 can also be flowable such as a B-stage material providing conformal coverage of components including gaps around the components. The wire-in-film insulator 402 can also be curable thus hardening during a curing process.

The package integrated circuit 404 such as a wire bond die or a pre-tested known good inverted ISM or BGA package can be attached or mounted over the base integrated circuit 406 with an attach material 408. The base integrated circuit 406 such as a flip chip die or a pre-tested known good inverted ISM or BGA package can be attached or mounted adjacent a connection array 410.

The connection array 410 such as an organic lamination substrate, a metal frame substrate, or other material can include array connectors 412 and substrate conductors 414. The substrate conductors 414 provide electrical connectivity with the array connectors 412 through the connection array 410.

The connection array 410 can include a substrate cavity 416 providing spacing for the base integrated circuit 406. The base integrated circuit 406 can be attached or mounted at least partially in the substrate cavity 416 and providing a side of the base integrated circuit 406 opposite the wire-in-film insulator 402 at least partially exposed.

Package die connectors 420 such as bond wires, planar interconnect, or other conductors can electrically connect the package integrated circuit 404 to the substrate conductors 414 on a side of the connection array 410 opposite base die connectors 422. The base die connectors 422 can be formed of a conductive material such as solder bumps for electrical connectivity to another component including a next level subsystem or system.

A buffer layer 424 can be applied over the wire-in-film insulator 402 on a side opposite the connection array. The buffer layer 424 can include an insulation material providing compensation for mismatched coefficients of thermal expansion between an adhesive layer 426 and the wire-in-film insulator 402.

The adhesive layer 426 can be applied over the buffer layer 424 for attaching or mounting a stiffener 428 such as organic material, polymeric material, metal, ceramic or other material including a heat spreader material. The stiffener 428 can be attached or mounted over the adhesive layer 426 during processing and can optionally be removed.

Figure 5:
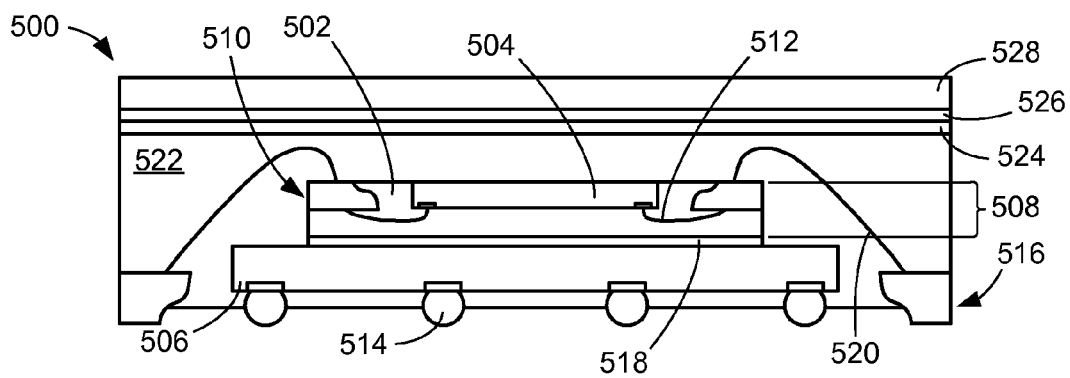
FIG. 5 is a cross-sectional view of an integrated circuit package system in a fourth embodiment of the present invention.

Referring now to FIG. 5, therein is shown a cross-sectional view of an integrated circuit package system 500 in a fourth embodiment of the present invention. The integrated circuit package system 500 preferably includes a first wire-in-film insulator 502, a package integrated circuit 504 over a base integrated circuit 506.

The first wire-in-film insulator 502 and the package integrated circuit 504 can be included in a stack module 508. The first wire-in-film insulator 502 of the stack module 508 can be attached or mounted over the base integrated circuit 506 such as a flip chip or other device.

The first wire-in-film insulator 502 can be formed of a wire-in-film encapsulation material. The first wire-in-film insulator 502 can also be flowable such as a B-stage material providing conformal coverage of components including gaps around the components. The first wire-in-film insulator 502 can also be curable thus hardening during a curing process.

The package integrated circuit 504 can be attached or mounted adjacent a first connection array 510 such as a lead array for a leadless package. In a manner similar to the connection array 110 of FIG. 1, the first connection array 510 can be registered or locked in the first wire-in-film insulator 502 and have a substantially fixed position.

The package integrated circuit 504 can electrically connect to the first connection array 510 with package die connectors 512. The first wire-in-film insulator 502 with the package integrated circuit 504, the first connection array 510, and the package die connectors 512 can form the stack module 508.

The base integrated circuit 506 can include base die connectors 514 such as solder bumps or other conductor. The base die connectors 514 can provide electrical connectivity to another component including a next level subsystem or system such as another package or a printed circuit board.

The base integrated circuit 506 can be attached or mounted adjacent a second connection array 516 similar to the first connection array 510. The second connection array 516 such as a lead array for a leadless package can provide electrical connectivity for the base integrated circuit 506.

The stack module 508 can be attached or mounted over the base integrated circuit 506 with an attach material 518. Stack module connectors 520 can electrically connect the stack module 508 and the second connection array 516.

A second wire-in-film insulator 522 can be formed over the stack module 508, the base integrated circuit 506, the stack module connectors 520, and the second connection array 516. The second wire-in-film insulator 522 and the first wire-in-film insulator 502 can be of a same material, a different material, or combination thereof.

A buffer layer 524 can be applied over the second wire-in-film insulator 522 on a side opposite the second connection array 516. The buffer layer 524 can include an insulation material providing compensation for mismatched coefficients of thermal expansion between an adhesive layer 526 and the second wire-in-film insulator 522.

The adhesive layer 526 can be applied over the buffer layer 524 for attaching or mounting a stiffener 528 such as organic material, polymeric material, metal, ceramic or other material including a heat spreader material. The stiffener 528 can be attached or mounted over the adhesive layer 526 during processing and can optionally be removed.

Figure 6:
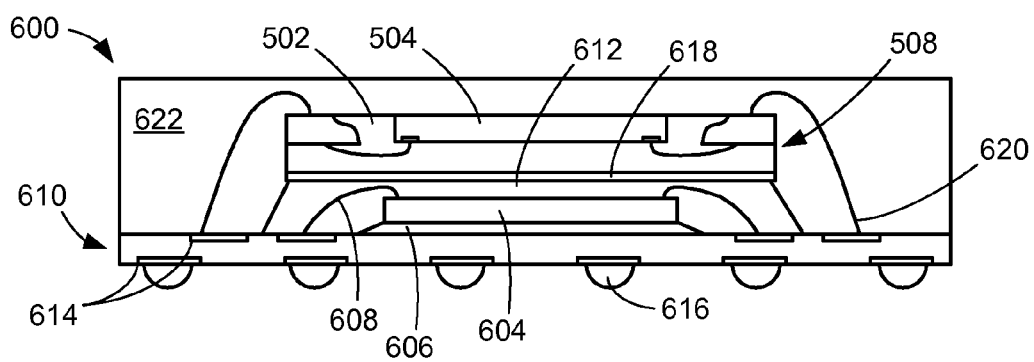
FIG. 6 is a cross-sectional view of an integrated circuit package system in a fifth embodiment of the present invention.

Referring now to FIG. 6, therein is shown a cross-sectional view of an integrated circuit package system 600 in a fifth embodiment of the present invention. The integrated circuit package system 600 preferably includes the stack module 508 having the first wire-in-film insulator 502 and the package integrated circuit 504 over a base integrated circuit 604.

The base integrated circuit 604 can be attached with a base die attach material 606 and base die connectors 608 over a substrate 610. The base die attach material 606 can provide a substantially fixed position for the base integrated circuit 604 over the substrate 610.

The base die connectors 608 can electrically connect the base integrated circuit 604 to the substrate 610 and thereby provide electrical connectivity to another component such as a next level subsystem or system.

A base insulator 612 can be formed over the base integrated circuit 604, the base die connectors 608, and a portion of the substrate 610. The base insulator 612 can be an insulating material such as wire-in-film encapsulation material or mold compound.

The substrate 610 such as an organic lamination substrate, a metal frame substrate, or other material can include substrate conductors 614 and substrate connectors 616. The substrate conductors 614 provide electrical connectivity with the substrate connectors 616 through the substrate 610.

The stack module 508 can be attached or mounted over the base integrated circuit 604 with an attach material 618. Stack module connectors 620 can electrically connect the stack module 508 and the substrate 610 including the substrate conductors 614.

A second insulator 622 can be formed over the stack module 508, the base integrated circuit 604, the stack module connectors 620, and a portion of the substrate 610. The second insulator 622 can be an insulating material such as wire-in-film encapsulation material or mold compound.

Figure 7:
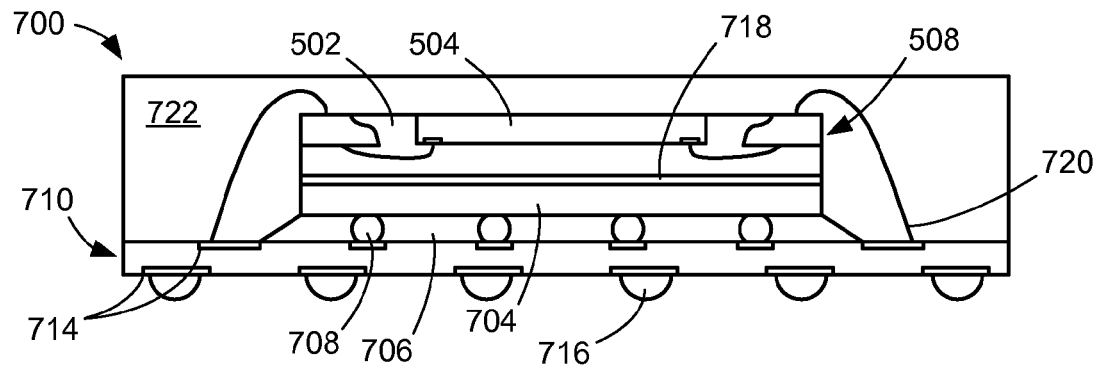
FIG. 7 is a cross-sectional view of an integrated circuit package system in a sixth embodiment of the present invention.

Referring now to FIG. 7, therein is shown a cross-sectional view of an integrated circuit package system 700 in a sixth embodiment of the present invention. The integrated circuit package system 700 preferably includes the stack module 508 having the first wire-in-film insulator 502 and the package integrated circuit 504 over a base integrated circuit 704.

The base integrated circuit 704 such as a flip chip can be attached with a fill material 706 and base die connectors 708 over a substrate 710. The fill material 706 can provide structural support for the base integrated circuit 704 and the base die connectors 708 such as solder bumps or other conductor.

The base die connectors 708 can connect the base integrated circuit 704 to the substrate 710 thereby providing electrical connectivity to another component including a next level subsystem or system such as another package or a printed circuit board.

The substrate 710 such as an organic lamination substrate, a metal frame substrate, or other material can include substrate conductors 714 and substrate connectors 716. The substrate conductors 714 provide electrical connectivity with the substrate connectors 716 through the substrate 710.

The stack module 508 can be attached or mounted over the base integrated circuit 704 with an attach material 718. Stack module connectors 720 can electrically connect the stack module 508 and the substrate 710 including the substrate conductors 714.

A second insulator 722 can be formed over the stack module 508, the base integrated circuit 704, the stack module connectors 720, and a portion of the substrate 710. The second insulator 722 can be an insulating material such as wire-in-film encapsulation material or mold compound.

Figure 8:
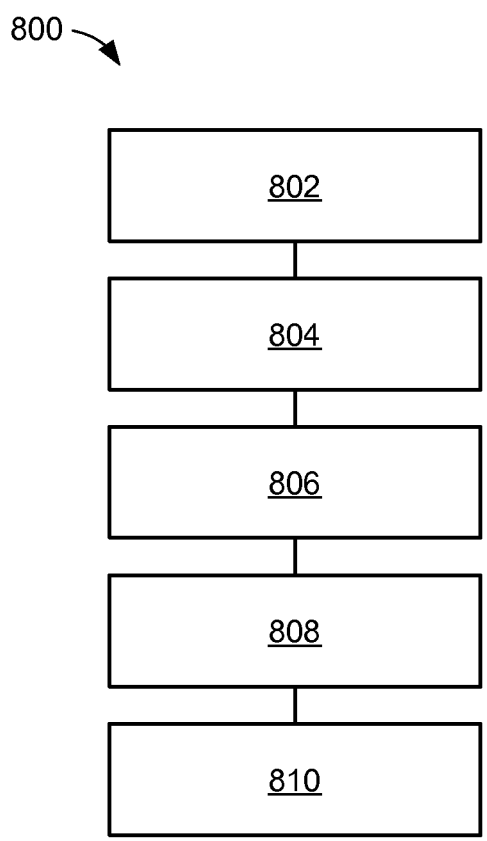
FIG. 8 is a flow chart of an integrated circuit package system for manufacturing the integrated circuit package system in an embodiment of the present invention.

Referring now to FIG. 8, therein is shown a flow chart of an integrated circuit package system 800 for manufacturing the integrated circuit package system 100 in an embodiment of the present invention. The system 800 includes providing a connection array in a block 802; attaching a base integrated circuit adjacent the connection array in a block 804; attaching a package integrated circuit over the base integrated circuit in a block 806; attaching a package die connector to the package integrated circuit and the connection array in a block 808; and applying a wire-in-film insulator over the package integrated circuit, the first die connector, the base integrated circuit, and the connection array, wherein the connection array is partially exposed in a block 810.

In greater detail, a system to provide the method and apparatus of the integrated circuit package system 100, in an embodiment of the present invention, is performed as follows:
1. Forming a connection array having array connectors.
2. Mounting a base integrated circuit having base die connectors adjacent the array connectors of the connection array.
3. Attaching a package integrated circuit having over the base integrated circuit on a side opposite the base die connectors.
4. Connecting a package die connector to the package integrated circuit and the connection array with array connectors.
5. Forming a wire-in-film insulator over the package integrated circuit, the first die connector, the base integrated circuit, the base die connectors, and the connection array, wherein the array connectors are partially exposed.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a connection array;
   attaching a base integrated circuit adjacent the connection array;
   attaching a package integrated circuit over the base integrated circuit;
   attaching a package die connector to the package integrated circuit and the connection array;
   applying a wire-in-film insulator over the package integrated circuit, the package die connector, the base integrated circuit, and the connection array, wherein the connection array and a base die connector of the base integrated circuit are partially exposed from the wire-in-film insulator; and mounting a stiffener over the wire-in-film insulator opposite the connection array.

2. The method as claimed in claim 1 wherein providing the connection array includes providing array connectors and a connection array pad.

3. The method as claimed in claim 1 wherein providing the connection array includes providing a substrate.

4. The method as claimed in claim 1 further comprising:
providing a second connection array;
attaching the base integrated circuit adjacent the second connection array; and
attaching a stack module having the package integrated circuit and the wire-in-film insulator over the base integrated circuit.

5. The method as claimed in claim 1 further comprising:
providing a substrate;
attaching the base integrated circuit over the substrate; and
attaching a stack module having the package integrated circuit and the wire-in-film insulator over the base integrated circuit.

6. A method for manufacturing an integrated circuit package system comprising:
forming a connection array having array connectors;
mounting a base integrated circuit having base die connectors adjacent the array connectors of the connection array;
attaching a package integrated circuit over the base integrated circuit on a side opposite the base die connectors;
connecting a package die connector to the package integrated circuit and the connection array with the array connector;
forming a wire-in-film insulator over the package integrated circuit, the package die connector, the base integrated circuit, the base die connectors, and the connection array, wherein the array connectors and the base die connectors are partially exposed from the wire-in-film insulator; and
mounting a stiffener over the wire-in-film insulator opposite the connection array.

7. The method as claimed in claim 6 wherein providing the connection array includes providing the array connectors and a punched-up die pad having characteristics of a leadframe.

8. The method as claimed in claim 6 wherein providing the connection array includes providing a substrate having a substrate cavity for the base integrated circuit.

9. The method as claimed in claim 6 further comprising:
providing a second connection array;
attaching the base integrated circuit adjacent the second connection array;
attaching a stack module having the package integrated circuit and the wire-in-film insulator over the base integrated circuit; and
forming a second insulator over the stack module and the base integrated circuit.

10. The method as claimed in claim 6 further comprising:
providing a substrate;
attaching the base integrated circuit over the substrate;
attaching a stack module having the package integrated circuit and the wire-in-film insulator over the base integrated circuit; and
forming a second insulator over the stack module and the base integrated circuit.

11. An integrated circuit package system comprising:
a connection array;
a base integrated circuit adjacent the connection array;
a package integrated circuit over the base integrated circuit;
a package die connector attached to the package integrated circuit and the connection array;
a wire-in-film insulator over the package integrated circuit, the package die connector, the base integrated circuit, and the connection array, wherein the connection array and a base die connector of the base integrated circuit is partially exposed from the wire-in-film insulator; and
a stiffener over the wire-in-film insulator opposite the connection array.

12. The system as claimed in claim 11 wherein the connection array includes array connectors and a connection array pad.

13. The system as claimed in claim 11 wherein the connection array is a substrate.

14. The system as claimed in claim 11 further comprising:
a second connection array with the base integrated circuit attached adjacent the second connection array; and
a stack module having the package integrated circuit and the wire-in-film insulator over the base integrated circuit.

15. The system as claimed in claim 11 further comprising:
a substrate with the base integrated circuit over the substrate; and
a stack module having the package integrated circuit and the wire-in-film insulator over the base integrated circuit.

16. The system as claimed in claim 11 wherein:
the connection array has array connectors;
the base integrated circuit is adjacent the array connectors of the connection array;
the package integrated circuit is over the base integrated circuit on a side opposite the base die connectors;
the package die connector is connected to the package integrated circuit and the connection array with the array connectors; and
the wire-in-film insulator is over the package integrated circuit, the package die connector, the base integrated circuit, the base die connectors, and the connection array, wherein the array connectors are partially exposed.

17. The system as claimed in claim 16 wherein the connection array includes the array connectors and a punched-up die pad having characteristics of a leadframe.

18. The system as claimed in claim 16 wherein the connection array is a substrate having a substrate cavity for the base integrated circuit.

19. The system as claimed in claim 16 further comprising:
a second connection array with the base integrated circuit adjacent the second connection array;
a stack module having the package integrated circuit and the wire-in-film insulator over the base integrated circuit; and
a second insulator over the stack module and the base integrated circuit.

20. The system as claimed in claim 16 further comprising:
a substrate with the base integrated circuit over the substrate;
a stack module having the package integrated circuit and the wire-in-film insulator over the base integrated circuit; and
a second insulator over the stack module and the base integrated circuit.

* * * * *